ns008675114B2

(12) United States Patent
Watanabe et al.

(10) Patent No.: US 8,675,114 B2
(45) Date of Patent: Mar. 18, 2014

(54) IMAGE PICKUP APPARATUS

(75) Inventors: Toshio Watanabe, Kanagawa (JP); Kenji Yamamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 405 days.

(21) Appl. No.: 12/000,806

(22) Filed: Dec. 18, 2007

(65) Prior Publication Data

US 2008/0165270 A1 Jul. 10, 2008

(30) Foreign Application Priority Data

Jan. 9, 2007 (JP) .................................. 2007-001633

(51) Int. Cl.
*H04N 5/225* (2006.01)
*H04N 5/222* (2006.01)

(52) U.S. Cl.
USPC ....................................... 348/335; 348/218.1

(58) Field of Classification Search
USPC .......... 348/239, 335, 340, 345, 357, 360, 369
See application file for complete search history.

(56) References Cited

U.S. PATENT DOCUMENTS 7,259,917 B2 * 8/2007 Hillis et al. ................... 359/619
2010/0026852 A1 * 2/2010 Ng et al. ....................... 348/239

FOREIGN PATENT DOCUMENTS

| JP | 05-111037 | 4/1993 |
| JP | 2004-096358 | 3/2004 |
| WO | WO-2006/039486 A2 | 4/2006 |
| WO | WO 2007092545 A2 * | 8/2007 |

OTHER PUBLICATIONS

Ng et al., "Light Field Photography with a Hand-held Plenoptic Camera", Stanford Tech Report CTSR Feb. 2005, pp. 1-11.

* cited by examiner

*Primary Examiner* — Timothy J Henn
(74) *Attorney, Agent, or Firm* — Rader, Fishman & Grauer PLLC (57) ABSTRACT

An image pickup apparatus capable of switching between image pickup modes is provided. An image pickup apparatus includes; an image pickup lens; an image pickup device receiving light from the image pickup lens to obtain image pickup data; an image processing section for performing image processing on the image pickup data obtained from the image pickup device; a microlens array section including a plurality of microlenses, and arranged between the image pickup lens and the image pickup device; and a driving section changing a relative distance between the microlens array section and the image pickup device.

13 Claims, 11 Drawing Sheets

IMAGE PICKUP APPARATUS

CROSS REFERENCES TO RELATED APPLICATIONS

The present invention contains subject matter related to Japanese Patent Application JP 2007-001633 filed in the Japanese Patent Office on Jan. 9, 2007, the entire contents of which are incorporated herein by reference.

BACKGROUND OF THE INVENTION

1. Field of the Invention

The present invention relates to an image pickup apparatus using a microlens array.

2. Description of the Related Art

Various image pickup apparatuses have been proposed and developed in the past. Moreover, an image pickup apparatus performing predetermined image processing on image pickup data obtained by picking up an image to output the image pickup data has been proposed.

For example, in International Patent Publication No. 06/039486 and Ren.Ng, et al. "Light Field Photography with a Hand-Held Plenoptic. Camera", Stanford Tech Report CTSR 2005-02, an image pickup apparatus using a technique called "Light Field Photography" is proposed. The image pickup apparatus includes an image pickup lens, a microlens array, a light-sensing device and an image processing section, and image pickup data obtained by the light-sensing device includes the intensity distribution of light on a light-sensing surface as well as information about the traveling direction of the light. Thereby, in the image processing section, an image viewed from an arbitrary viewpoint or an arbitrary direction can be reproduced.

SUMMARY OF THE INVENTION

In the case where an image pickup apparatus using the above-described technique is configured, it is conceivable that the image pickup apparatus is used by appropriately switching between a normal high-resolution image pickup mode which does not use the technique and an image pickup mode in which an image is reproduced through the use of the technique. Therefore, a proposal of an image pickup apparatus capable of such switching between image pickup modes is desired.

In view of the foregoing, it is desirable to provide an image pickup apparatus capable of switching between image pickup modes.

According to an embodiment of the invention, there is provided an image pickup apparatus including: an image pickup lens; an image pickup device receiving light from the image pickup lens to obtain image pickup data; an image processing section for performing image processing on the image pickup data obtained from the image pickup device; a microlens array section including a plurality of microlenses, that is arranged between the image pickup lens and the image pickup device; and a driving section changing a relative distance between the microlens array section and the image pickup device.

In the image pickup apparatus according to the embodiment of the invention, by the function of the driving section, a relative distance between the microlens array section and the image pickup device is changed, so, for example, in the case where the relative distance becomes substantially the same as the focal length of the microlens array section, incident light from the image pickup lens is refracted by the microlens array so as to be condensed on the image pickup device. Moreover, for example, in the case where the microlens array section and the image pickup device are arranged in proximity to each other, incident light from the image pickup lens is not refracted, and reaches the image pickup device as it is. Therefore, switching between an image pickup mode in which image processing is performed on the image pickup data obtained by condensing the incident light to the microlens array on the image pickup device and an image pickup mode in which the incident light reaches the image pickup device as it is to obtain the image pickup data can be performed.

The image pickup apparatus according to the embodiment of the invention includes a control section controlling the image processing section and the driving section; and in a first image pickup mode, the control section can bring the microlens array section and the image pickup device closer to each other, and can stop image processing by the image processing section; and in a second image pickup mode, the control section can control the driving section to make the relative distance substantially the same as the focal length of the microlens array section, and can control to perform the image processing. In such a configuration, the first image pickup mode is the image pickup mode in which the incident light to the microlens array reaches the image pickup device as it is to obtain the image pickup data, and the second image pickup mode is the image pickup mode in which image processing is performed on the image pickup data obtained by condensing the incident light on the image pickup device.

In the image pickup apparatus according to the embodiment of the invention, the microlenses are preferably arranged in a direction in which an operation distance in the second image pickup mode becomes longer. In such a configuration, in the first image pickup mode, the focal position of each microlens is positioned at the further rear of the image pickup device as viewed from the microlens, so the incident light from the image pickup lens is more resistant to refraction, and a decline in the resolution of a picked-up image can be further prevented. Therefore, the qualities of a picked-up image and an image after image processing can be further improved.

In the image pickup apparatus according to the embodiment of the invention, the driving section changing a relative distance between the microlens array section and the image pickup device is arranged, so, for example, switching between the image pickup mode in which image processing is performed on the image pickup data obtained by condensing the incident light to the microlens array on the image pickup device and the image pickup mode in which the incident light reaches the image pickup device as it is to obtain the image pickup data can be performed.

Other and further objects, features and advantages of the invention will appear more fully from the following description.

DETAILED DESCRIPTION OF THE PREFERRED EMBODIMENTS

Preferred embodiments will be described in detail below by referring to the accompanying drawings.

First Embodiment

Figure 1:
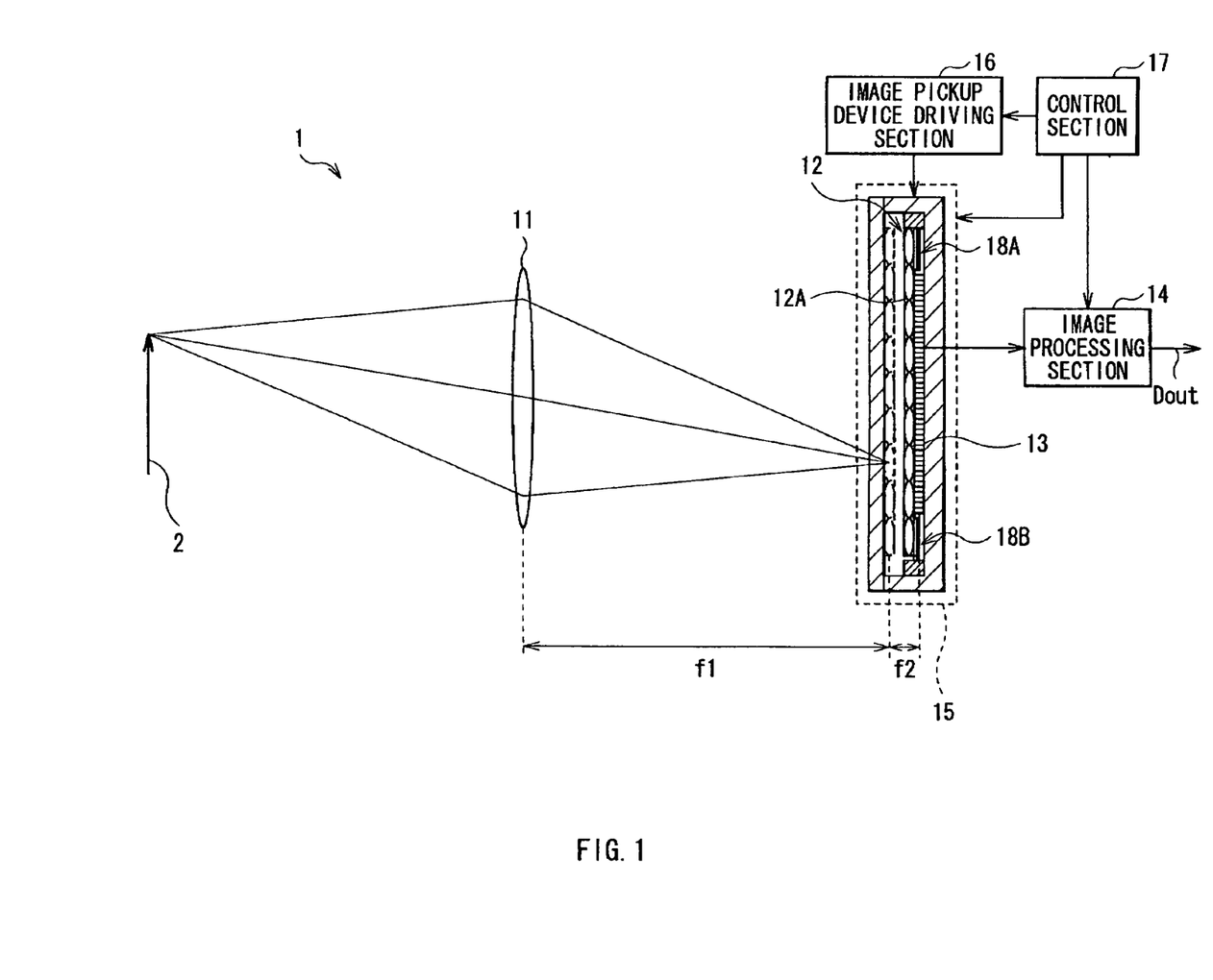
FIG. 1 is a block diagram showing the configuration of an image pickup apparatus according to a first embodiment of the invention.

FIG. 1 shows the whole configuration of an image pickup apparatus (an image pickup apparatus 1) according to a first embodiment of the invention. The image pickup apparatus 1 picks up an image of an object 2 to output image pickup data Dout, and includes an image pickup lens 11, an image pickup unit section 15, an image processing section 14, an image pickup device driving section 16 and a control section 17.

The image pickup lens 11 is a main lens for picking up an image of an object, and includes, for example, a typical image pickup lens used in a video camera, a still camera or the like.

The image pickup unit section 15 is a section serving an image pickup function when picking up an image, and includes a microlens array 12, an image pickup device 13 and a pair of bimetals 18A and 18B. A specific configuration of the image pickup unit section 15 will be described later.

The image pickup device driving section 16 drives the image pickup device 13, and controls the light-sensing operation of the image pickup device 13.

The image processing section 14 performs predetermined image processing on image pickup data obtained by the image pickup device 13 in an image processing/image pickup mode, which will be described later, and then outputs the image pickup data as image pickup data Dout. More specifically, for example, refocusing arithmetic processing using a technique called "Light Field Photography" is performed, and thereby an image viewed from an arbitrary viewpoint or an arbitrary direction can be reproduced.

The control section 17 controls the operations of the image processing section 14, the image pickup device driving section 16 and a heat supply section (heat supply sections 19A and 19B), which will be described later in the image pickup unit section 15. More specifically, the driving operation of the image pickup device driving section 16 is appropriately controlled, and as will be described in detail later, the operations of the image processing section 14 and the image pickup unit section 15 (more specifically, the heat supply sections 19A and 19B which will be described later) are controlled in response to two image pickup modes, which will be described later. The control section 17 includes, for example, a microcomputer or the like.

Figure 2:
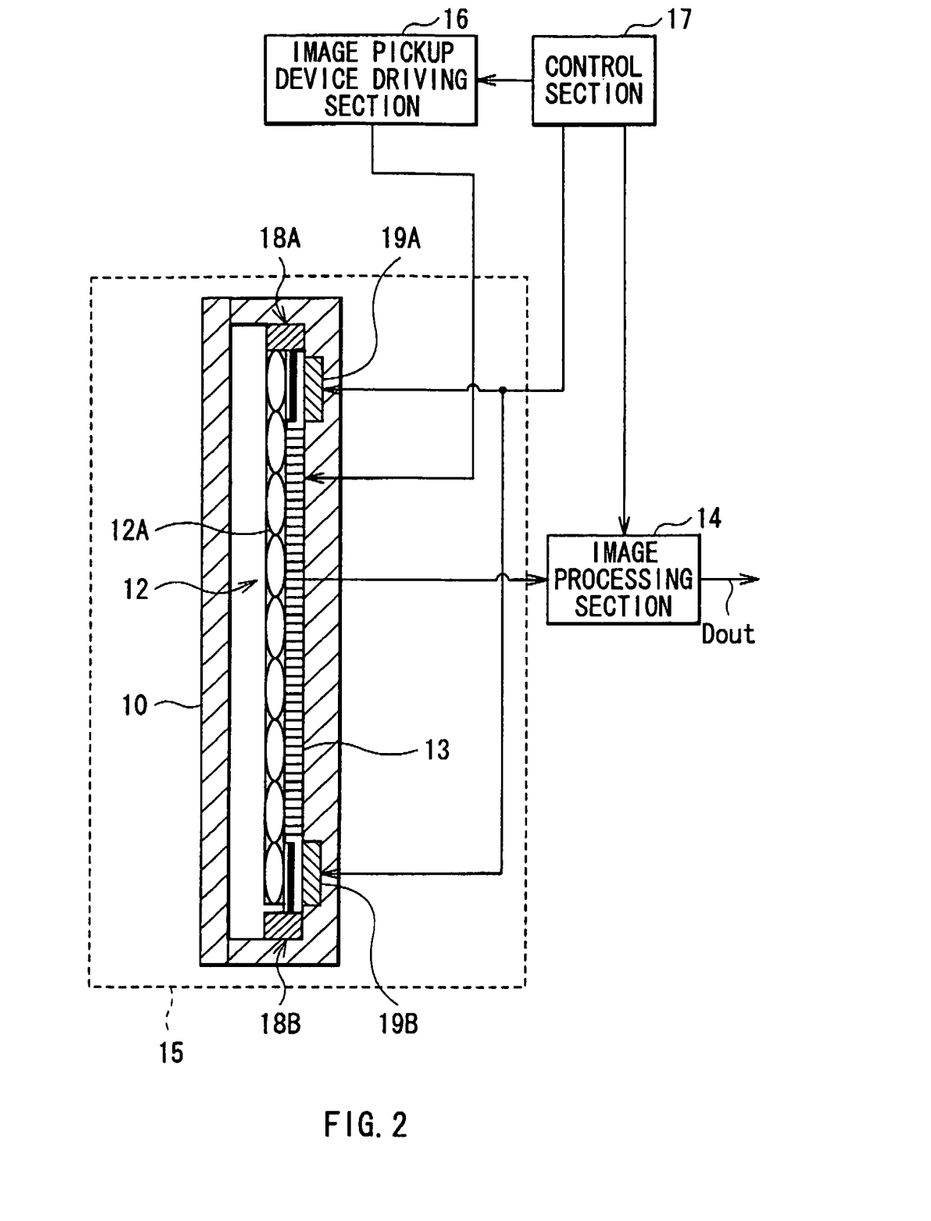
FIG. 2 is a sectional view showing a specific configuration of the image pickup unit section shown in FIG. 1.
Figure 3A:
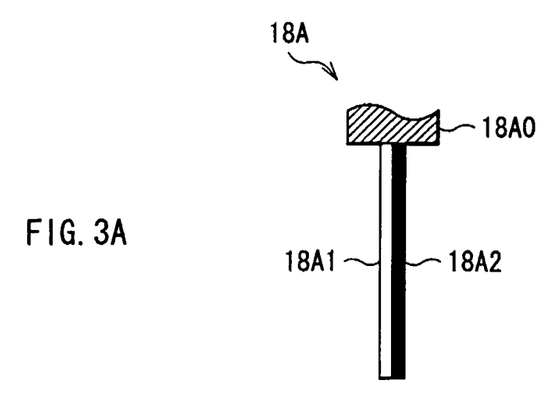
FIGS. 3A and 3B are sectional views for describing a specific configuration of the bimetal shown in FIG. 2.
Figure 3B:
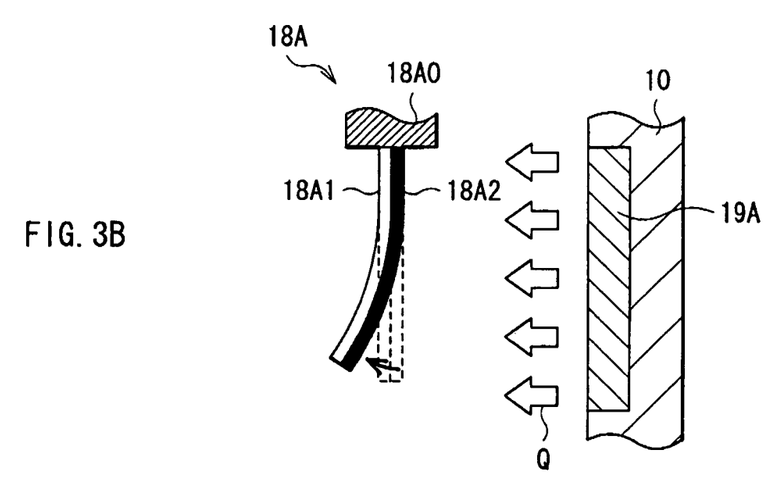

Next, referring to FIGS. 2, 3A and 3B, the specific configuration of the image pickup unit section 15 will be described below. FIG. 2 shows a sectional view of the specific configuration of the image pickup unit section 15; and FIGS. 3A and 3B show sectional views of specific configurations of the bimetal 18A in the image pickup unit section 15.

In the image pickup unit section 15, the microlens array 12, the image pickup device 13, the bimetals 18A and 18B and the heat supply sections 19A and 19B are arranged in an enclosure 10.

The microlens array 12 includes a plurality of microlenses 12A arranged in a matrix form, and is arranged in proximity to (preferably in contact with) the image pickup device 13 along an optical axis direction. As shown in FIG. 1, the microlens array 12 is arranged on a focal plane of the image pickup lens 11 (a reference numeral f1 in FIG. 1 represents the focal length of the image pickup lens 11) in the image processing/image pickup mode, which will be described later.

The image pickup device 13 senses light to generate image pickup data, and includes, for example, a plurality of CCDs (charge coupled devices) arranged in a matrix form. As shown in FIG. 1, the image pickup device 13 is arranged on the focal plane of the microlens array 12 (a reference numeral f2 in the drawing represents the focal length of the microlens array 12) in the image processing/image pickup mode, which will be described later.

For example, as shown in FIG. 3A, the bimetals 18A and 18B are each formed by laminating two metal plates 18A1 and 18A2 with different thermal expansion coefficients, and an end portion of each of the metal plates 18A1 and 18A2 is supported by a support section 18A0. The metal plate 18A1 is made of, for example, inver (an alloy of iron and nickel) or the like, and the metal plate 18A2 is made of, for example, an alloy formed by adding manganese, chromium, copper or the like to an alloy of iron and nickel.

The heat supply sections 19A and 19B are arranged in the vicinity of the bimetals 18A and 18B, respectively, and more specifically, in the vicinity of metal plates with a higher thermal expansion coefficient of the bimetals 18A and 18B (in this case, in the vicinity of the metal plate 18A2 or the like opposite to the microlens array 12). In such a configuration, for example, as shown in FIG. 3B, when the heat supply sections 19A and 19B supply a predetermined heat amount Q to the bimetals 18A and 18B, respectively, the shapes of the bimetals 18A and 18B are deformed due to a difference in the thermal expansion coefficients between two metal plates, and the bimetals 18A and 18B are bent toward metal plates with a smaller thermal expansion coefficient (for example, toward the metal plate 18A1 or the like). Therefore, as will be described in detail later, in response to whether or not such heat supply is provided (or in response to the amount of supplied heat), switching between two modes (an image pickup mode using a normal high resolution (hereinafter referred to as a normal image pickup mode) and an image pickup mode in which image processing is performed by the image processing section 14 (hereinafter referred to as an image processing/image pickup mode) is performed. The heat supply sections 19A and 19B and the above-described bimetals 18A and 18B correspond to specific examples of "a driving section" in the invention.

Figure 4A:
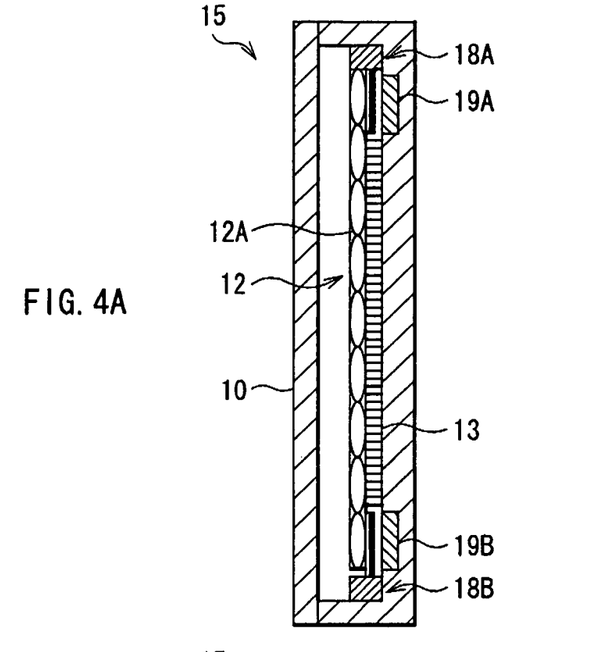
FIGS. 4A and 4B are sectional views for describing the function of the image pickup unit section shown in FIG. 1.
Figure 4B:
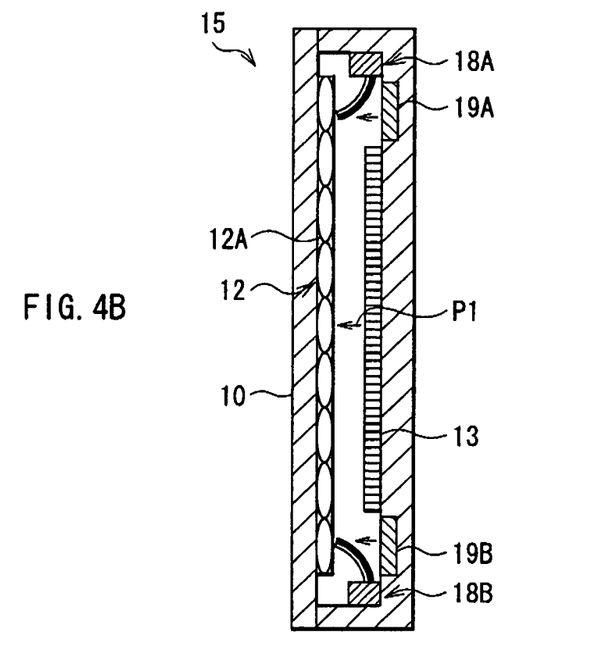

Next, referring to FIGS. 1 to 6, the operation of the image pickup apparatus 1 according to the embodiment will be described in detail below. FIGS. 4A and 4B show sectional views for describing the function of the image pickup unit section 15; FIG. 4A shows the case where heat is not supplied to the bimetals 18A and 18B (in the normal image pickup mode); and FIG. 4B shows the case where heat is supplied to the bimetals 18A and 18B (in the image processing/image pickup mode).

In the image pickup apparatus 1, an image of the object 2 by the image pickup lens 11 is formed on the microlens array 12. Then, an incident light ray to the microlens array 12 reaches the image pickup device 13 via the microlens array 12, and image pickup data are obtained from the image pickup device 13 according to the driving operation by the image pickup device driving section 16.

In this case, in the image pickup unit section 15, in response to whether or not heat is supplied from the heat supply sections 19A and 19B to the bimetals 18A and 18B (or in response to the amount of supplied heat), the shapes of the bimetals 18A and 18B are deformed as described above, and thereby the microlens array 12 is shifted in an optical axis direction.

More specifically, in the case where heat is not supplied from the heat supply sections 19A and 19B to the bimetals 18A and 18B, as shown in FIG. 3A, the shapes of the bimetals 18A and 18B are not deformed; therefore, for example, as shown in FIG. 4A, the microlens array 12 and the image pickup device 13 are kept in proximity to (or in contact with) each other. Therefore, incident light from the image pickup lens 11 is not refracted by the microlens array 12, and the incident light reaches the image pickup device 13 as it is.

On the other hand, in the case where heat is supplied from the heat supply sections 19A and 19B to the bimetals 18A and 18B, as shown in FIG. 3B, the shapes of the bimetals 18A and 18B are deformed and bent; therefore, for example, as shown by a reference numeral P1 in FIG. 4B, the microlens array 12 is shifted toward a side opposite to the image pickup device 13 (toward the image pickup lens 11) along the optical axis direction, thereby a relative distance between the microlens array 12 and the image pickup device 13 is changed, and the microlens array 12 comes close to (or comes into contact with) the enclosure 10. In this case, where the microlens array 12 moves to a position in proximity to (or in contact with) the enclosure 10 in such a manner, as described above (refer to FIG. 1), a relative distance between the microlens array 12 and the image pickup device 13 is set to be the same (or substantially the same) as the focal length f2 of the microlens array 12, so the incident light from the image pickup lens 11 is refracted by the microlens array 12, and the incident light is condensed on the image pickup device 13.

Moreover, the control section 17 controls the heat supply sections 19A and 19B to stop supplying heat in the normal image pickup mode (a first image pickup mode). Therefore, in the normal image pickup mode, an image by the image pickup lens 11 reaches the image pickup device 13 as it is, and image pickup data with a normal high resolution are obtained.

On the other hand, in the image processing/image pickup mode (a second image pickup mode), the control section 17 controls the heat supply sections 19A and 19B to supply heat. Therefore, in the image processing/image pickup mode, incident light to the microlens array 12 is condensed on the image pickup device 13.

Next, the image pickup data obtained in the image pickup device 13 is inputted into the image processing section 14. Then, in the image processing section 14, according to control by the control section 17, predetermined image processing (for example, the above-described refocusing arithmetic processing) is performed on the image pickup data, and thereby the image pickup data Dout is outputted.

More specifically, in the normal image pickup mode, the control section 17 controls the image processing section 14 to stop image processing, and as a result, the inputted image pickup data is outputted as the image pickup data Dout as it is.

On the other hand, in the image processing/image pickup mode, the control section 17 controls the image processing section 14 to perform image processing, and as a result, predetermined image processing is performed on the inputted image pickup data, and the image pickup data is outputted as the image pickup data Dout.

Now, referring to FIGS. 5 and 6, an example of image processing by the image processing section 14 (the above-described refocusing arithmetic processing) will be described in detail below.

Figure 5:
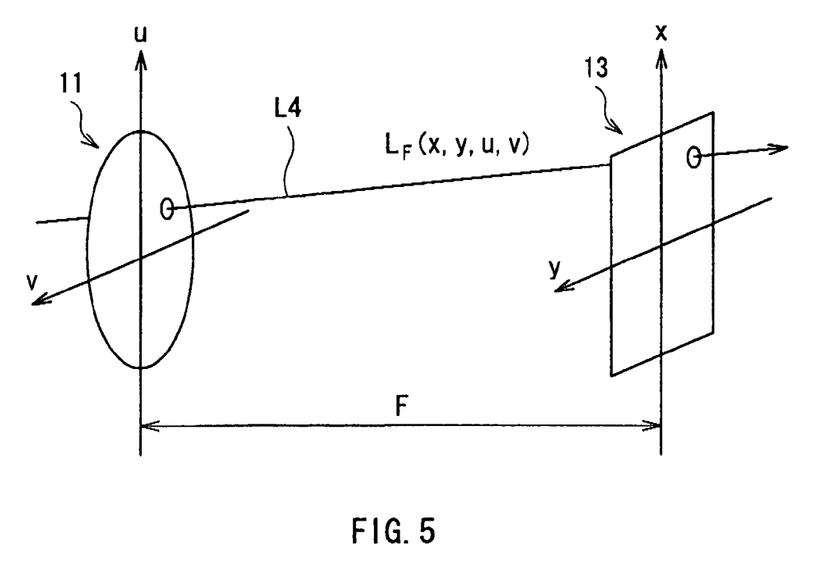
FIG. 5 is a schematic perspective view for describing an example of image processing in an image processing/image pickup mode.

At first, as shown in FIG. 5, assuming that a rectangular coordinate system (u, v) is defined on an image pickup lens plane of the image pickup lens 11, a rectangular coordinate system (x, y) is defined on an image pickup plane of the image pickup device 13, and a distance between the image pickup lens plane of the image pickup lens 11 and the image pickup plane of the image pickup device 13 is F, a light ray passing through the image pickup lens 11 and the image pickup device 13 as shown in the drawing is represented by a four-dimensional function $L_F(x, y, u, v)$, so the light ray in a state in which in addition to information about the position of the light ray is kept; the traveling direction of the light ray is shown.

Figure 6:
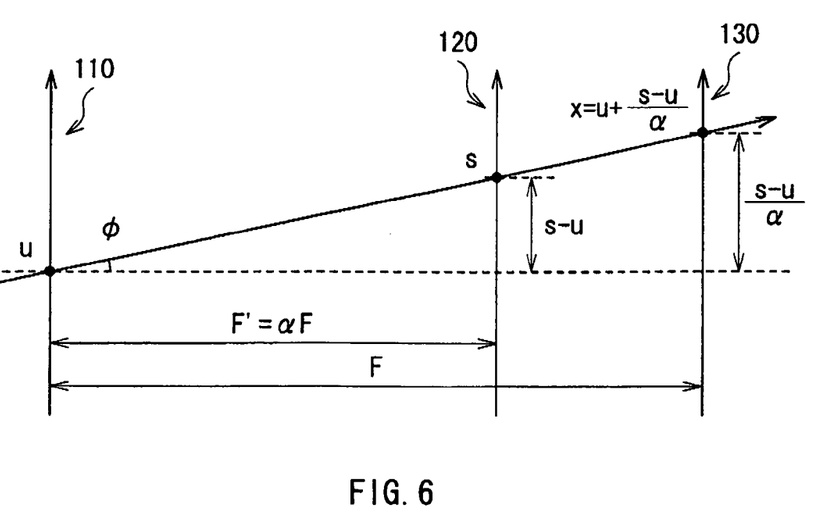
FIG. 6 is a schematic sectional view for describing an example of image processing in the image processing/image pickup mode.

In this case, as shown in FIG. 6, a positional relationship between an image pickup lens plane 110, an image pickup plane 130 and a refocus plane 120 is set (the refocus plane 120 is set to be $F'=\alpha F$), and a detection strength $L_{F'}$ on the image pickup plane 130 of coordinates (s, t) on the refocus plane 120 is represented by the following Formula 1. Moreover, an image $E_{F'}(s, t)$ obtained on the refocus plane 120 is the value obtained by integrating the above-described detection strength $L_{F'}$ with respect to a lens aperture, so the image $E_{F'}(s, t)$ is represented by the following Formula 2. Therefore, when a refocusing arithmetic operation is performed from Formula 2, on the basis of the image pickup data Dout after image processing, an image viewed from an arbitrary viewpoint or an arbitrary direction is reproduced.

$$L_{F'}(s, t, u, v) = L_{(\alpha \cdot F)}(s, t, u, v)$$ Formula 1
$$= L_F\left(u + \frac{s-u}{\alpha}, v + \frac{t-v}{\alpha}, u, v\right)$$
$$= L_F\left\{u\left(1 - \frac{1}{\alpha}\right) + \frac{s}{\alpha}, v\left(1 - \frac{1}{\alpha}\right) + \frac{t}{\alpha}, u, v\right\}$$

$$E_{F'}(s, t) = \frac{1}{F'^2} \int\int L_{F'}(s, t, u, v) du dv$$ Formula 2
$$= \frac{1}{\alpha^2 F^2} \int\int L_F\left\{u\left(1 - \frac{1}{\alpha}\right) + \frac{s}{\alpha}, v\left(1 - \frac{1}{\alpha}\right) + \frac{t}{\alpha}, u, v\right\} du dv$$

Thus, in the embodiment, in response to the functions of the heat supply sections 19A and 19B, more specifically, in response to whether or not heat is supplied to the bimetals 18A and 18B (or in response to the amount of supplied heat), a relative distance between the microlens array 12 and the image pickup device 13 is changed. In other words, for example, in the case where heat is supplied to the bimetals 18A and 18B, the microlens array 12 is shifted toward a side opposite to the image pickup device 13 along the optical axis direction, so the relative distance becomes the same as (or substantially the same as) the focal length f2 of the microlens array 12, and as a result, incident light from the image pickup lens 11 is refracted by the microlens array 12, and the incident light is condensed on the image pickup device 13. Moreover, for example, in the case where heat is not supplied to the bimetals 18A and 18B, the microlens array 12 and the image pickup device 13 are kept in proximity to (or in contact with) each other, so incident light from the image pickup lens 11 is not refracted by the microlens array 12, and reaches the image pickup device 13 as it is. Therefore, switching between an image pickup mode (the image processing/image pickup mode) in which predetermined image processing is performed on image pickup data obtained by condensing the incident light to the microlens array 12 on the image pickup device 13 and an image pickup mode (the normal image pickup mode) in which the incident light reaches the image pickup device 13 as it is to obtain image pickup data can be performed.

As described above, in the embodiment, a relative distance between the microlens array 12 and the image pickup device 13 is changed by the bimetals 18A and 18B and the heat supply sections 19A and 19B in the image pickup unit section 15, so switching between the image pickup mode (the image processing/image pickup mode) in which predetermined image processing is performed on the image pickup data obtained by condensing incident light to the microlens array 12 on the image pickup device 13 and the image pickup mode (the normal image pickup mode) in which the incident light reaches the image pickup device 13 as it is to obtain the image pickup data can be performed.

Second Embodiment

Next, a second embodiment of the invention will be described below. An image pickup apparatus according to the embodiment includes an image pickup unit section including a pair of piezoelectric actuators, instead of the image pickup unit section 15 including a pair of bimetals 18A and 18B in the image pickup apparatus 1 described in the first embodiment. Like components are denoted by like numerals as in the first embodiment, and will not be further described.

Figure 7:
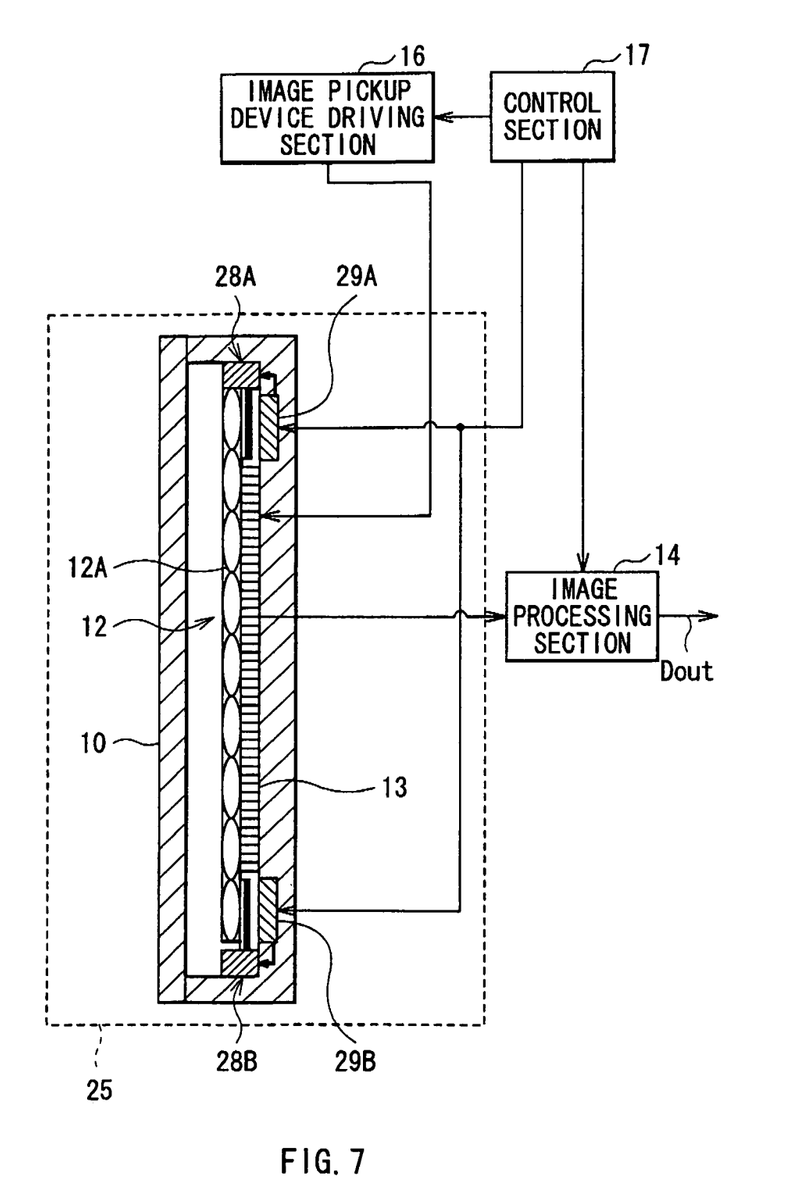
FIG. 7 is a sectional view showing the configuration of an image pickup unit section according to a second embodiment of the invention.

FIG. 7 shows a sectional view of the image pickup unit section (an image pickup unit section 25) according to the embodiment. The image pickup unit section 25 includes a pair of piezoelectric actuators 28A and 28B, instead of a pair of bimetals 18A and 18B in the image pickup apparatus 15 described in the first embodiment, and a pair of voltage supply sections 29A and 29B, instead of a pair of heat supply sections 19A and 19B.

Figure 8A:
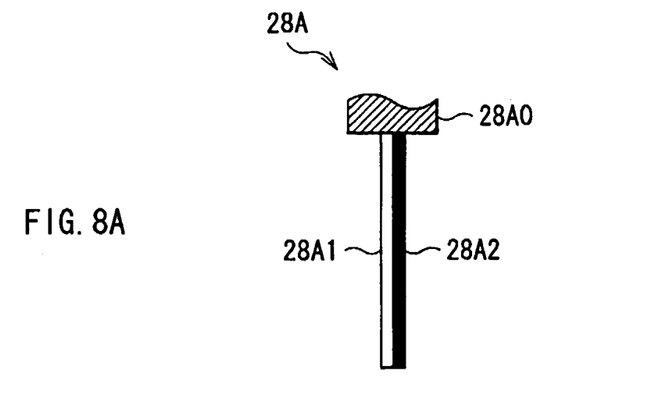
FIGS. 8A and 8B are sectional views for describing a specific configuration of the piezoelectric actuator shown in FIG. 7.

For example, as shown in FIG. 8A, the piezoelectric actuators 28A and 28B are each formed by laminating two different piezoelectric devices 28A1 and 28A2, and an end portion of each of the piezoelectric actuators 28A and 28B is supported by a support section 28A0. The piezoelectric devices 28A1 and 28A2 are each made of, for example, lead zirconate titanate (commonly called PZT), barium titanate ($BaTiO_3$) or the like.

Figure 8B:
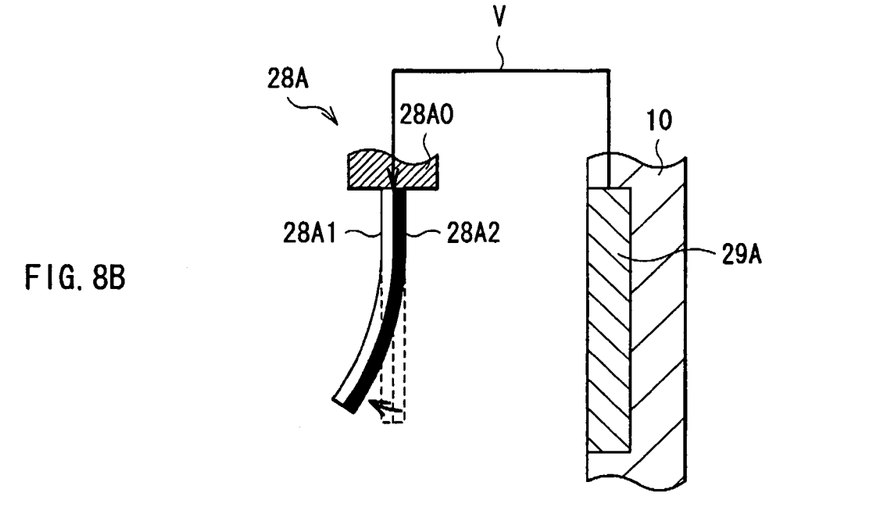

The voltage supply sections 29A and 29B are arranged in the vicinity of the piezoelectric actuators 28A and 28B, respectively. As in the case of the bimetals 18A and 18B in the first embodiment, for example, as shown in FIG. 8B, when the voltage supply sections 29A and 29B supply a predetermined voltage V to the piezoelectric actuators 28A and 28B, respectively, the shapes of the piezoelectric actuators 28A and 28B are deformed due to a difference between the piezoelectric properties of two piezoelectric devices 28A1 and 28A2, and the piezoelectric actuators 28A and 28B are bent. The voltage supply sections 29A and 29B and the above-described piezoelectric actuators 28A and 28B correspond to specific examples of "a driving section" in the invention.

Figure 9A:
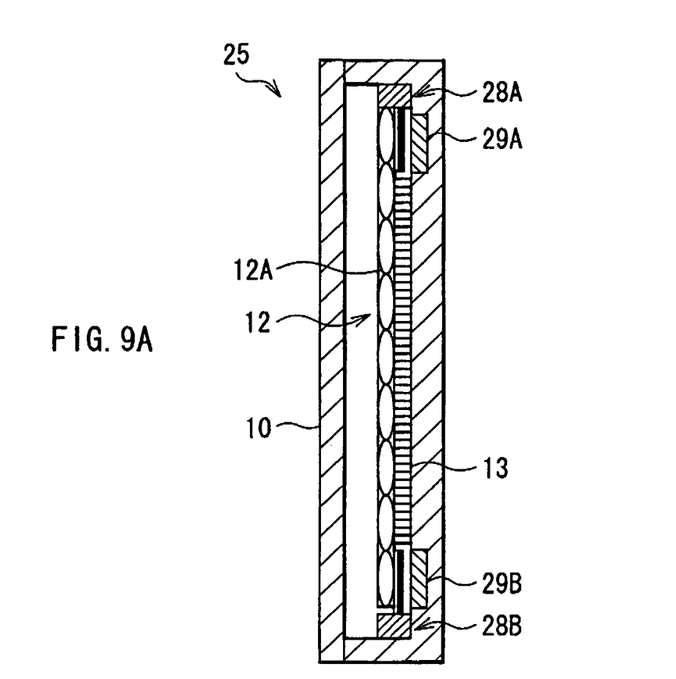
FIGS. 9A and 9B are sectional views for describing the function of the image pickup unit section shown in FIG. 7.
Figure 9B:
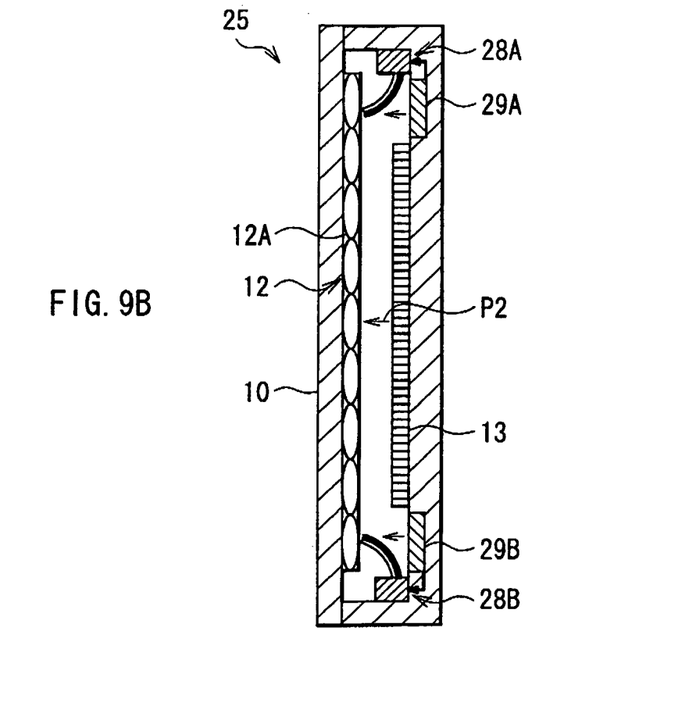

In such a configuration in the embodiment, for example, as shown in FIGS. 9A and 9B, as in the case of the first embodiment, in response to whether or not a voltage is supplied from the voltage supply sections 29A and 29B to the piezoelectric actuators 28A and 28B (or in response to the magnitude of a supplied voltage), a relative distance between the microlens array 12 and the image pickup device 13 is changed, so switching between an image pickup mode (the image processing/image pickup mode) in which predetermined image processing is performed on image pickup data obtained by condensing incident light to the microlens array 12 on the image pickup device 13 and an image pickup mode (the normal image pickup mode) in which the incident light reaches the image pickup device 13 as it is to obtain the image pickup data can be performed. Therefore, as in the case of the first embodiment, switching between image pickup modes can be performed.

Although the invention is described by referring to the first embodiment and the second embodiment, the invention is not limited to them and can be variously modified.

Figure 10A:
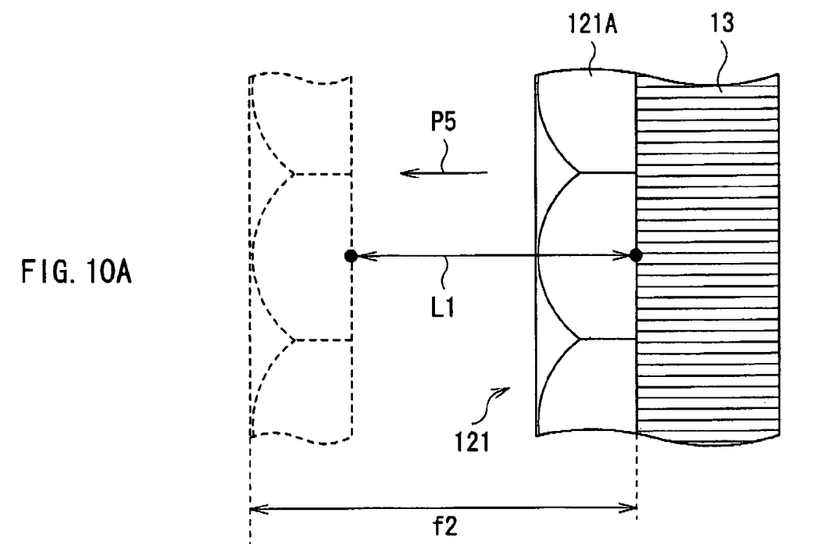
FIGS. 10A and 10B are sectional views for describing a configuration example of a microlens array according to a modification of the invention.
Figure 10B:
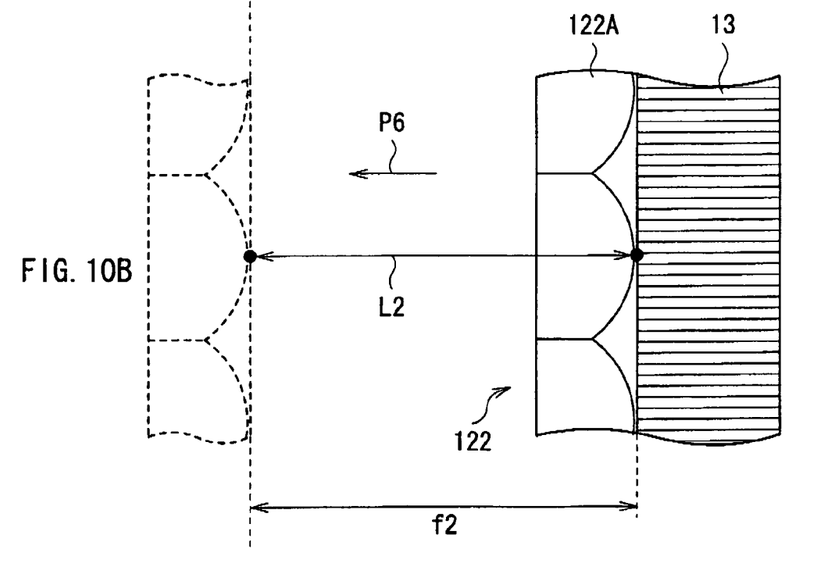

For example, in the above-described embodiments, the case where in each microlens 12A in the microlens array 12 both surfaces of each microlens 12 are convex surfaces and have the same curvature is described; however, the shape of each microlens is not limited to this case. In the case where the curvatures of both surfaces of the microlens are different, the microlens is preferably arranged so that the curvature of a surface on a side closer to the image pickup device 13 is larger than the curvature of a surface on a side closer to the image pickup lens 11. More specifically, it is more preferable to arrange the convex surface of each microlens 122A on a side closer to the image pickup device 13, for example, as shown in a microlens array 122 in FIG. 10B, than to arrange the convex surface of each microlens 121A on a side closer to the image pickup lens 11, for example, as shown in a microlens array 121 in FIG. 10A. More commonly, when the case of a liquid lens or a cemented lens (a compound lens) is considered, compared to arranging each microlens so that, for example, as shown in FIG. 10A, an operation distance (operation distance: L1) in the case where the microlens array 121 is shifted in the optical axis direction as indicated by an arrow P5 to switch to the image processing/image pickup mode is shorter, it is more preferable to arrange each microlens so that, for example, as shown in FIG. 10B, an operation distance (operation distance: L2) in the case where the microlens array 122 is shifted in the optical axis direction as indicated by an arrow P6 to switch to the image processing/image pickup mode is longer. In the case where each microlens is arranged in the latter case, in the normal image pickup mode, the focal position of each microlens is positioned at the further rear of the image pickup device 13 as viewed from the microlens, so the incident light from the image pickup lens 11 is more resistant to refraction, so a decline in the resolution of a picked-up image can be further prevented. Therefore, in such a configuration, the qualities of a picked-up image and an image after image processing can be further improved.

Figure 11A:
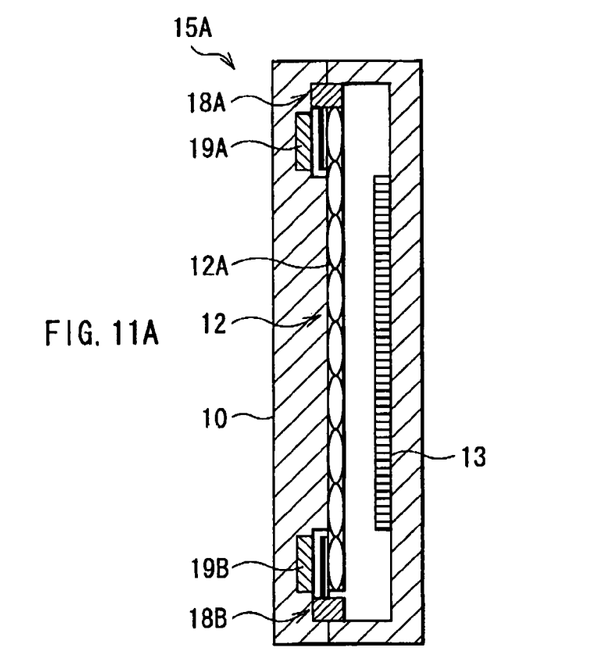
FIGS. 11A and 11B are sectional views for describing the configuration and function of an image pickup unit section according to a modification of the invention.
Figure 11B:
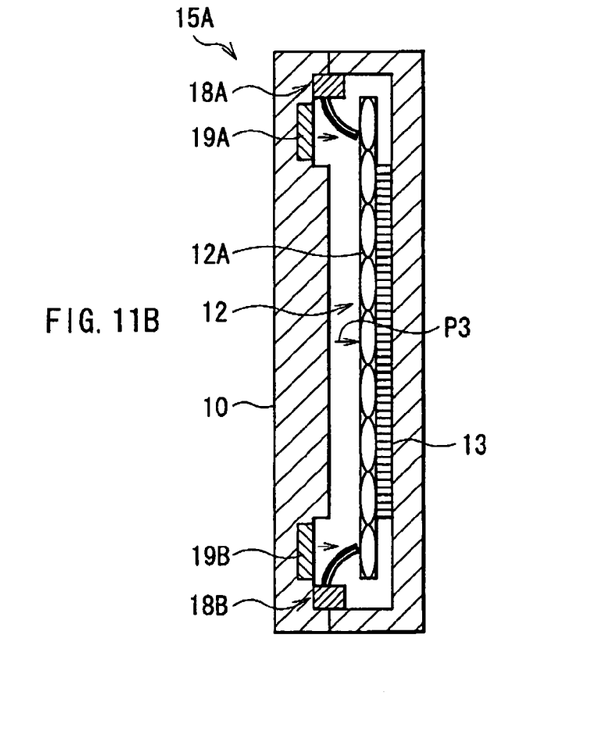

Moreover, in the above-described embodiments, as shown in FIGS. 4A, 4B, 9A and 9B, the case where the bimetals 18A and 18B and the heat supply sections 19A and 19B or the piezoelectric actuators 28A and 28B and the voltage supply sections 29A and 29B are arranged on a side closer to the image pickup device 13 of the microlens array 12, and when heat or a voltage is not supplied, the image pickup apparatus enters the normal image pickup mode, and when heat or a voltage is supplied, the image pickup apparatus enters the image processing/image pickup mode is described; however, for example, as shown in an image pickup unit section 15A in FIGS. 11A and 11B, in the case where the bimetals 18A and 18B and the heat supply sections 19A and 19B or the piezoelectric actuators 28A and 28B and the voltage supply sections 29A and 29B are arranged on a side opposite to the image pickup device 13 of the microlens array 12, when heat or a voltage is not supplied (refer to FIG. 11A), the image pickup apparatus may enter the image processing/image pickup mode, and when heat or a voltage is supplied (refer to FIG. 11B), the image pickup apparatus may enter the normal image pickup mode. In such a configuration, the same effects as those in the above-described embodiments can be obtained.

Figure 12A:
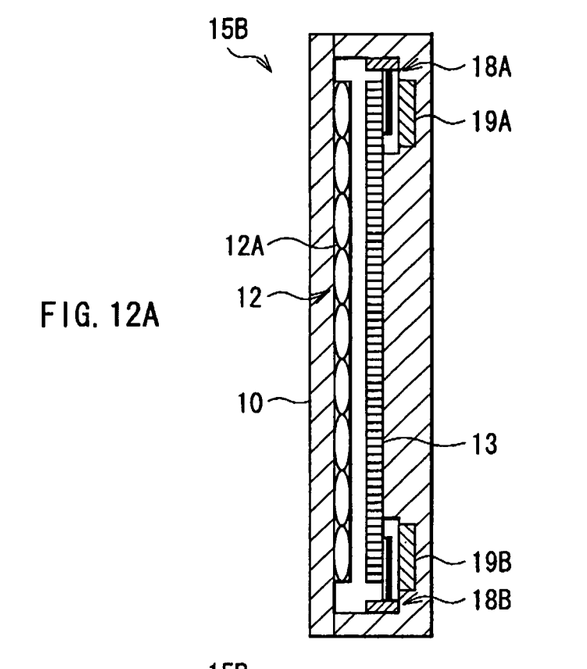
FIGS. 12A and 12B are sectional views for describing the configuration and function of an image pickup unit section according to another modification of the invention.
Figure 12B:
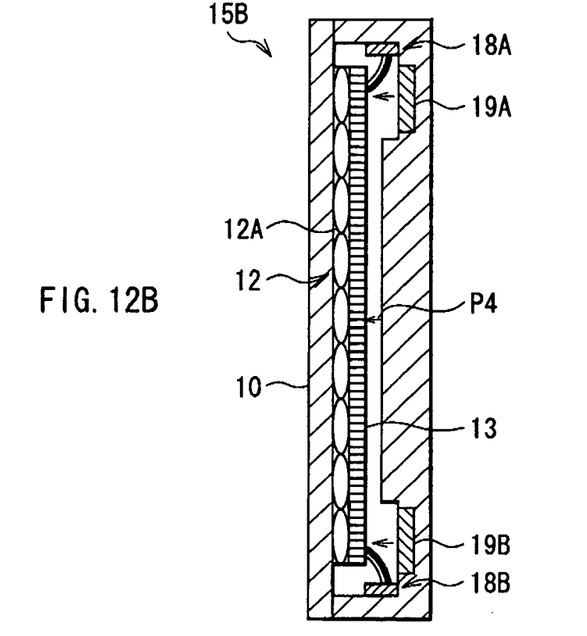

Further, in the above-described embodiments, the case where the microlens array 12 is shifted in the optical axis direction to change a relative distance between the microlens array 12 and the image pickup device 13 is described; however, for example, as in the case of an image pickup unit section 15B shown in FIGS. 12A and 12B, the bimetals 18A and 18B and the heat supply sections 19A and 19B or the piezoelectric actuators 28A and 28B and the voltage supply sections 29A and 29B may be arranged in the vicinity of end portions (a top end and a bottom end) of the image pickup device 13 (more specifically, on a side opposite to the microlens array 12 of the image pickup device 13), and a relative distance between the microlens array 12 and the image pickup device 13 may be changed by shifting the image pickup device 13 in the optical axis direction. In such a configuration, when heat or a voltage is not supplied (refer to FIG. 12A), the image pickup apparatus enters the image processing/image pickup mode, and when heat or a voltage is supplied (refer to FIG. 12B), the image pickup apparatus enters the normal image pickup mode. In such a configuration, the same effects as those in the above-described embodiments can be obtained. In addition, even in this case, contrary to the positions shown in FIGS. 12A and 12B, the bimetals 18A and 18B and the heat supply sections 19A and 19B or the piezoelectric actuators 28A and 28B and the voltage supply sections 29A and 29B may be arranged on a side closer to the microlens array 12 of the image pickup device 13, and when heat or a voltage is not supplied, the image pickup apparatus may enter the normal image pickup mode, and when heat or a voltage is supplied, the image pickup apparatus may enter the image processing/image pickup mode.

Moreover, the case where the voltage supply section supplying a voltage to the piezoelectric actuators 28A and 28B is arranged in the image pickup unit section 25 (more specifically, in vicinity to the piezoelectric actuators 28A and 28B) is described above; however, such a voltage supply section may be arranged outside the image pickup unit section 25. In such a configuration, the configuration of the image pickup unit section can be further simplified and the size of the image pickup unit section can be reduced.

Further, in the above-described embodiments, as an example of an image processing method in the image processing section 14, refocusing arithmetic processing using "Light Field Photography" is described; however, the image processing method in the image processing section 14 is not limited to this, and any other image processing method may be used.

It should be understood by those skilled in the art that various modifications, combinations, subcombinations and alterations may occur depending on design requirements and other factors insofar as they are within the scope of the appended claims or the equivalents thereof.

What is claimed is:

1. An image pickup apparatus comprising:
an image pickup lens;
an image pickup device configured to receive light from the image pickup lens and generate image pickup data based on the received light;
an image processing section configured to selectively perform light field photography image processing on the image pickup data;
a microlens array section including a plurality of microlenses and arranged on an optical axis between the image pickup lens and the image pickup device;
a driving section configured to change a relative distance between the microlens array section and the image pickup device based on a control signal,
a control section configured to control the image processing section and the driving section,
wherein the image pickup apparatus is configured to selectively operate in at least a first image pickup mode and a second image pickup mode,
wherein, when the image pickup apparatus is operating in the second image pickup mode, the control section causes the driving section to make the relative distance substantially the same as the focal length of the microlens array section and causes the image processing section to perform the light field photography image processing on the image pickup data,
wherein, when the image pickup apparatus is operating in the first image pickup mode, the control section causes the driving section to make the relative distance smaller than the focal length of the microlens array section and causes the image processing section to not perform the light field photography image processing on the image pickup data,
wherein each of the plurality of microlenses have a first side with a first curvature and a second side with a second curvature that is smaller than the first curvature, and
wherein each of the plurality of microlenses are arranged such that their first side is disposed closer to the image pickup device than their second side.

2. The image pickup apparatus according to claim 1, wherein
each of the plurality of microlenses microlenses are convex lenses, and
at least the first surface of each of the plurality of microlenses is a convex surface.

3. The image pickup apparatus according to claim 1, wherein
the driving section changes the relative distance by shifting the microlens array section in a direction parallel to the optical axis.

4. The image pickup apparatus according to claim 1, wherein
the driving section changes the relative distance by shifting the image processing section in a direction parallel to the optical axis.

5. The image pickup apparatus according to claim 1, wherein
the driving section includes:
a piezoelectric actuator arranged on an end portion of the microlens array section or the image pickup device, and
a voltage supply section supplying a voltage to the piezoelectric actuator.

6. The image pickup apparatus according to claim 1, further comprising:

a pair of bimetals arranged on an end portion of the microlens array section or the image pickup device configured to have two metal plates with different thermal expansion coefficients; and heating supply sections configured for supplying a predetermined heat supply to the pair of bimetals such that the pair of bimetals can bend in multiple directions.

7. The image pickup apparatus according to claim 1, wherein when the image pickup apparatus is operating in the first image pickup mode, the control section causes the driving section to make the relative distance substantially zero.

8. An image pickup apparatus comprising:

an image pickup lens;

an image pickup device configured to receive light from the image pickup lens and generate image pickup data based on the received light;

an image processing section configured to selectively perform light field photography image processing on the image pickup data;

a microlens array section including a plurality of microlenses and arranged on an optical axis between the image pickup lens and the image pickup device;

a driving section configured to change a relative distance between the microlens array section and the image pickup device based on a control signal, a control section configured to control the image processing section and the driving section, wherein the image pickup apparatus is configured to selectively operate in at least a first image pickup mode and a second image pickup mode, wherein, when the image pickup apparatus is operating in the second image pickup mode, the control section causes the driving section to make the relative distance substantially the same as the focal length of the microlens array section and causes the image processing section to perform the light field photography image processing on the image pickup data, wherein, when the image pickup apparatus is operating in the first image pickup mode, the control section causes the driving section to make the relative distance smaller than the focal length of the microlens array section and causes the image processing section to not perform the light field photography image processing on the image pickup data, wherein each of the plurality of microlenses is a compound lens, and wherein each of the plurality of microlenses is oriented such that an operation distance thereof is made equal to a focal length thereof, the operation distance corresponding to a distance from a side of the microlens that is closest to the image processing section to a point corresponding to the focal length of the microlens.

9. The image pickup apparatus according to claim 7, wherein the driving section changes the relative distance by shifting the microlens array section in a direction parallel to the optical axis.

10. The image pickup apparatus according to claim 7, wherein the driving section changes the relative distance by shifting the image processing section in a direction parallel to the optical axis.

11. The image pickup apparatus according to claim 7, wherein the driving section includes:

a piezoelectric actuator arranged on an end portion of the microlens array section or the image pickup device, and a voltage supply section supplying a voltage to the piezoelectric actuator.

12. The image pickup apparatus according to claim 8, further comprising:

a pair of bimetals arranged on an end portion of the microlens array section or the image pickup device configured to have two metal plates with different thermal expansion coefficients; and heating supply sections configured for supplying a predetermined heat supply to the pair of bimetals such that the pair of bimetals can bend in multiple directions.

13. The image pickup apparatus according to claim 7, wherein when the image pickup apparatus is operating in the first image pickup mode, the control section causes the driving section to make the relative distance substantially zero.

* * * * *